US009705288B2

(12) United States Patent
Wunderer et al.

(10) Patent No.: US 9,705,288 B2
(45) Date of Patent: *Jul. 11, 2017

(54) ELECTRON BEAM PUMPED VERTICAL CAVITY SURFACE EMITTING LASER

(71) Applicant: Palo Alto Research Center Incorporated, Palo Alto, CA (US)

(72) Inventors: Thomas Wunderer, Palo Alto, CA (US); Noble M. Johnson, Menlo Park, CA (US); John E. Northrup, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/828,207

(22) Filed: Aug. 17, 2015

(65) Prior Publication Data
US 2016/0049771 A1    Feb. 18, 2016

Related U.S. Application Data

(63) Continuation of application No. 13/523,681, filed on Jun. 14, 2012, now Pat. No. 9,112,332.

(51) Int. Cl.
*H01S 5/343* (2006.01)
*H01S 5/024* (2006.01)
(Continued)

(52) U.S. Cl.
CPC ............. *H01S 5/343* (2013.01); *B82Y 20/00* (2013.01); *H01S 5/02461* (2013.01); *H01S 5/04* (2013.01);
(Continued)

(58) Field of Classification Search
CPC .......... H01S 5/02461; H01S 5/04; H01S 5/14; H01S 5/1838; H01S 5/18383;
(Continued)

(56) References Cited

U.S. PATENT DOCUMENTS 4,730,334 A * 3/1988 Collins ............... H01S 3/09707
372/37
5,461,637 A * 10/1995 Mooradian ............. H01S 5/041
372/11
(Continued)

FOREIGN PATENT DOCUMENTS

EP        1208622       5/2003
EP        1720225       11/2006
(Continued)

OTHER PUBLICATIONS

File History for U.S. Appl. No. 13/523,681.
(Continued)

*Primary Examiner* — Xinning Niu
(74) *Attorney, Agent, or Firm* — Hollingsworth Davis, LLC

(57) ABSTRACT

A vertical external cavity surface emitting laser (VECSEL) structure includes a heterostructure and first and second reflectors. The heterostructure comprises an active region having one or more quantum well structures configured to emit radiation at a wavelength, $\lambda_{lase}$, in response to pumping by an electron beam. One or more layers of the heterostructure may be doped. The active region is disposed between the first reflector and the second reflector and is spaced apart from the first reflector by an external cavity. An electron beam source is configured to generate the electron beam directed toward the active region. At least one electrical contact is electrically coupled to the heterostructure and is configured to provide a current path between the heterostructure and ground.

21 Claims, 14 Drawing Sheets

(51) Int. Cl.
| | |
|---|---|
| *H01S 5/04* | (2006.01) |
| *H01S 5/14* | (2006.01) |
| *H01S 5/327* | (2006.01) |
| *B82Y 20/00* | (2011.01) |
| *H01S 5/30* | (2006.01) |
| *H01S 5/32* | (2006.01) |
| *H01S 5/183* | (2006.01) |
| *H01S 3/109* | (2006.01) |
| *H01S 5/022* | (2006.01) |

(52) U.S. Cl.
CPC ............... *H01S 5/14* (2013.01); *H01S 5/183* (2013.01); *H01S 5/1838* (2013.01); *H01S 5/18383* (2013.01); *H01S 5/305* (2013.01); *H01S 5/327* (2013.01); *H01S 5/3222* (2013.01); *H01S 5/34333* (2013.01); *H01S 3/109* (2013.01); *H01S 5/0222* (2013.01); *H01S 5/18358* (2013.01); *H01S 5/18369* (2013.01); *H01S 5/3086* (2013.01)

(58) Field of Classification Search
CPC ...... H01S 5/327; H01S 5/34333; H01S 5/343; H01S 5/18369
See application file for complete search history.

(56) References Cited

U.S. PATENT DOCUMENTS

| | | | |
|---|---|---|---|
| 5,677,923 A | 10/1997 | Rice et al. | |
| 5,706,306 A | 1/1998 | Jiang et al. | |
| 5,771,253 A | 6/1998 | Chang-Hasnain et al. | |
| 6,393,038 B1* | 5/2002 | Raymond | H01S 5/18383 372/22 |
| 6,556,602 B2 | 4/2003 | Rice et al. | |
| 6,611,544 B1 | 8/2003 | Jiang et al. | |
| 6,669,367 B2 | 12/2003 | Lin et al. | |
| 6,775,314 B1 | 8/2004 | Waldrip et al. | |
| 6,879,618 B2 | 4/2005 | Cok et al. | |
| 6,882,669 B2 | 4/2005 | Hang et al. | |
| 7,471,854 B2 | 12/2008 | Cho et al. | |
| 7,573,920 B2 | 8/2009 | Lee et al. | |
| 7,590,161 B1 | 9/2009 | Hug et al. | |
| 7,613,215 B2 | 11/2009 | Kim | |
| 7,733,936 B2 | 6/2010 | Okamoto | |
| 7,856,043 B2* | 12/2010 | Kim | H01S 5/141 372/22 |
| 8,000,371 B2 | 8/2011 | Strittmatter et al. | |
| 8,102,893 B2 | 1/2012 | Giaretta et al. | |
| 8,121,169 B2 | 2/2012 | Nguyen et al. | |
| 9,112,332 B2* | 8/2015 | Wunderer | H01S 5/02461 |
| 2003/0031218 A1 | 2/2003 | Yeh | |
| 2003/0081642 A1 | 5/2003 | Hwang et al. | |
| 2003/0214992 A1 | 11/2003 | Lester et al. | |
| 2004/0013154 A1 | 1/2004 | Zheng | |
| 2004/0233961 A1 | 11/2004 | Lutgen | |
| 2005/0100074 A1 | 5/2005 | Okazaki et al. | |
| 2005/0135450 A1 | 6/2005 | Katsuyama et al. | |
| 2005/0281309 A1 | 12/2005 | Kim | |
| 2006/0029112 A1 | 2/2006 | Young et al. | |
| 2006/0029120 A1 | 2/2006 | Mooradian et al. | |
| 2006/0140235 A1 | 6/2006 | Kim | |
| 2007/0274361 A1 | 11/2007 | Calvez et al. | |
| 2008/0031289 A1 | 2/2008 | Cho et al. | |
| 2008/0112443 A1 | 5/2008 | Lee et al. | |
| 2008/0117946 A1 | 5/2008 | Kim | |
| 2009/0232179 A1* | 9/2009 | Ikuta | H01S 5/18 372/50.124 |
| 2009/0296752 A1 | 12/2009 | Giaretta et al. | |
| 2010/0150193 A1* | 6/2010 | Bhat | B82Y 20/00 372/44.01 |
| 2011/0182312 A1* | 7/2011 | Chen | B82Y 20/00 372/45.01 |
| 2011/0216789 A1 | 9/2011 | Docter et al. | |
| 2011/0268143 A1 | 11/2011 | Strittmatter et al. | |
| 2013/0163627 A1* | 6/2013 | Seurin | H01S 5/423 372/36 |
| 2013/0250986 A1 | 9/2013 | Wunderer et al. | |
| 2013/0343420 A1 | 12/2013 | Northrup et al. | |
| 2014/0072009 A1 | 3/2014 | Wunderer et al. | |

FOREIGN PATENT DOCUMENTS

| | | |
|---|---|---|
| EP | 1648060 | 7/2008 |
| WO | WO03007437 | 1/2003 |
| WO | WO2004064211 | 7/2004 |
| WO | WO2006074011 | 7/2006 |
| WO | WO2007144471 | 12/2007 |
| WO | WO2009060365 | 5/2009 |
| WO | WO2011161775 | 12/2011 |

OTHER PUBLICATIONS

File History for U.S. Appl. No. 13/427,105.
File History for U.S. Appl. No. 13/427,335.
Amari et al., "Characterization of thickness, elemental distribution and band-gap properties in AlGaN/GaN quantum wells by aberration-corrected TEM/STEM" Journal of Physics: Conference Series 371, 2012, 4 pages.
Fedler et al., "High Reflectivity AlGaN/AlN DBR Mirrors Grown by PA-MBE", Phys. Stat. Sol. (c) ), No. 1, 2002, pp. 258-262.
Gronin et al., "Effective Green Semiconductor Lasers with Multiple CdSe/ZnSe QD Active Region for Electron Beam Pumping", Acta Physica Polonica A vol. 114, No. 5, 2008, 8 pages.
Kozlovsky et al., "E-beam Longitudinally Pumped Laser Based on ZnCdSe/ZnSe MQW Structure Grown by MBE on ZnSe(001) Substrate", Phys. Stat. Sol. (b), vol. 229, No. 2, 2002, pp. 1033-1038.
Kozlovsky et al., "E-beam Longitudinally Pumped Laser on MOVPE-Grown Hexagonal CdSSe/CdS MQW Structure", 10$^{th}$ European Workshop on MOVPE, Lecce, Italy Jun. 8-11, 2003, 4 pages.
Kozlovsky et al., "Electron-beam Pumped Laser Structures based on MBE Grown ZnCdSe/ZnSe Superlattices", Journal of Crystal Growth, vol. 159, 1996 pp. 609-612.
Kozlovsky et al., "E-beam Pumped Blue-Green VCSEL Based on ZnCdSe/ZnSe MQW Structure Grown by MBE on ZnSe Substrate", Laser Physics, vol. 8, No. 6, 1998, pp. 1118-1123.
Krestinokov, "Photopumped InGaN/GaN/AlGaN Vertical Cavity Surface Emitting Laser Operating at Room Temperature", Phys. Stat. sol. (b) 216, 1999 pp. 511-515.
Kuznetsov et al., "Design and Characteristics of High-Power (>0.5-W CW) Diode-Pumped Vertical-External-Cavity Surface-Emitting Semiconductor Lasers with Circular TEM$_{00}$ Beams", IEEE Journal of Selected Topics in Quantum Electronics, vol. 5, No. 3, 1999, pp. 561-573.
Lee et al., "7 W High-Efficiency Continuous-Wave Green Light Generation by Intracavity Frequency Doubling of an End-Pumped Vertical External-Cavity Surface Emitting Semiconductor Laser", Applied Physics Letters, vol. 89, 2006, 6 pages.
Rao et al., "Multiwavelength HCG-VCSEL Array", IEEE, 2010, pp. 11-12.
Skrobol et al., "A Miniature Electron Beam Pumped Laser", The European Physical Journal D, vol. 54, 2009, pp. 103-109.
Tiberi et al., "Electron Beam Pumped Lasers Based on II-VI Compound Nanostructures from the Visible to UVA", Phys. Status Solidi, vol. 247, No. 6, 2010, pp. 1547-1552.
Vysotsky et al., "Simulation of a Longitudinally Electron-beam-pumped Nanheterostructure Semiconductor Laser", Quantum Electronics, vol. 39, No. 11, 2009, pp. 1028-1032.
Wunderer et al., "In-Well Pumping of InGaN/GaN Vertical-External-Cavity Surface-Emitting Lasers", Appl. Phys. Lett. 99, 201109 (2011), 4 pages.
Yu et al., "Electron-beam Pumped Blue (462nm) VCSEL on MOVPE-grown ZnSSe/ZnMgSSe MQW Structure", Phys. Stat. Sol. (c) vol. 2, No. 2, 2005, pp. 935-938.

(56) References Cited

OTHER PUBLICATIONS

Zverev et al. "Low-threshold Electron-beam-pumped Green Quantum-well Heterostructure Semiconductor Lasers", Quantum Electronics, vol. 34, No. 10, 2004, pp. 909-911.
Search Report dated Jun. 28, 2013 from GB Application No. GB1305193.3, 4 pages.
Search Report dated Jun. 21, 2013 from GB Application No. GB1305179.2, 4 pages.
File History for EP App. No. 13170387.8 as retrieved from the EP Electronic File System on Oct. 28, 2016, 90 pages.

* cited by examiner

ELECTRON BEAM PUMPED VERTICAL CAVITY SURFACE EMITTING LASER

CROSS REFERENCE TO RELATED APPLICATIONS

This application is a continuation of U.S. Ser. No. 13/523,681 filed Jun. 14, 2012, now U.S. Pat. No. 9,112,332, which is incorporated herein by reference in its entirety.

STATEMENT REGARDING FEDERALLY SPONSORED RESEARCH AND DEVELOPMENT

This invention was made with Government support under U.S. Army Cooperative Agreement No. W911NF-10-02-0008 awarded by the U.S. Defense Threat Reduction Agency (DTRA). The Government has certain rights in this invention.

SUMMARY

Embodiments discussed below include a vertical external cavity surface emitting laser (VECSEL) structure that includes a heterostructure and first and second reflectors. The heterostructure comprises an active region that includes one or more quantum well structures configured to emit radiation at a wavelength, $\lambda_{lase}$, in response to pumping by an electron beam. The heterostructure is disposed between the first reflector and the second reflector and the heterostructure is spaced apart from the first reflector by an external cavity. An electron beam source is configured to generate the electron beam, which is directed toward the active region. At least one electrical contact is electrically coupled to the heterostructure and is configured to provide a current path between the heterostructure and ground.

According to various aspects, the VECSEL structure includes a substrate, which may be thinned to less than about 100 μm, the VECSEL structure includes a heat sink, the heterostructure includes one or more layers with one or both of n- and p-type doping in a range between about $10^{17}/cm^3$ to about $10^{20}/cm^3$, the electron beam comprises a stationary electron beam, and/or vias are disposed in at least one of the heterostructure and the second reflector.

Some embodiments involve methods of making a VECSEL structure. Some methods include epitaxially growing a heterostructure comprising an active region having one or more quantum wells structures configured to emit radiation having a wavelength, $\lambda_{lase}$, in response to an electron beam. The method includes forming a second reflector comprising a distributed Bragg reflector (DBR) and a contact. The heterostructure, second reflector, electrical contact, and a first reflector are arranged so that the heterostructure is disposed between the first reflector and the second reflector, the heterostructure is spaced apart from the first reflector by an external cavity, and the contact makes electrical contact with the heterostructure. An electron beam source is arranged to generate the electron beam that pumps the active region.

According to some aspects, the heterostructure is epitaxially grown on a first major surface of a substrate that is transparent to the wavelength, $\lambda_{lase}$, the substrate is thinned to a thickness of less than 100 μm, and a dielectric DBR is deposited on a second major surface of the substrate.

DESCRIPTION OF VARIOUS EMBODIMENTS

Semiconductor light emitting devices are used in a number of applications including data storage, displays, lighting, sensors, water purification, disinfection, UV curing, phototherapy, and medical diagnostics, among other uses. Light emitting devices that emit in spectral ranges suitable for these and other applications can be fabricated based on a variety of material systems, including group III-V and II-VI binary, ternary, and quaternary compounds and alloys and various combinations thereof. Vertical external cavity surface emitting lasers (VECSELs) are of interest due to the potential for high optical power coupled with the quality of spectral and spatial optical lasing characteristics. VECSELs have been used in optically pumped systems, however, the laser radiation emitted by the semiconductor gain region is limited by the pump wavelength. Furthermore, for wavelengths below 400 nm, compact optical pump sources are not readily available. As described below, semiconductor lasers pumped with an electron beam (e-beam) can achieve direct emission of radiation with VECSEL configurations that provide spectral and lasing characteristics and power output that is suitable for many more demanding applications.

Some embodiments discussed in this disclosure involve e-beam-pumped VECSELs having an active region comprising distributed quantum well structures arranged to take advantage of resonant periodic gain and which are compositionally designed to emit at the desired laser emission wavelength. The VECSEL implementations discussed herein can involve continuous-wave (cw), high power, compact, and lightweight e-beam pumped laser systems that provide high beam quality. The VECSEL structures incorporate highly reflective distributed Bragg reflectors (DBRs), e.g., ¼ wavelength DBRs. The active region is disposed between the DBRs and at least one of the reflectors is spaced apart from the active region to form an external cavity, which allows the generation of longitudinal single-mode operation, which can be useful for applications such as Raman Spectroscopy and/or other applications. In some implementations, the laser directly outputs UV radiation at wavelengths between 550 to 200 nm, e.g. between about 400 nm to 250 nm, or between about 300 and about 200 nm with spectral quality and output power suitable for spectroscopic applications. Depending on the material compositions used for the active region various wavelength ranges can be directly emitted. For example, InGaN is a useful material for the active region for blue or green visible light emission and AlGaN is useful to achieve UV emission.

Figure 1:
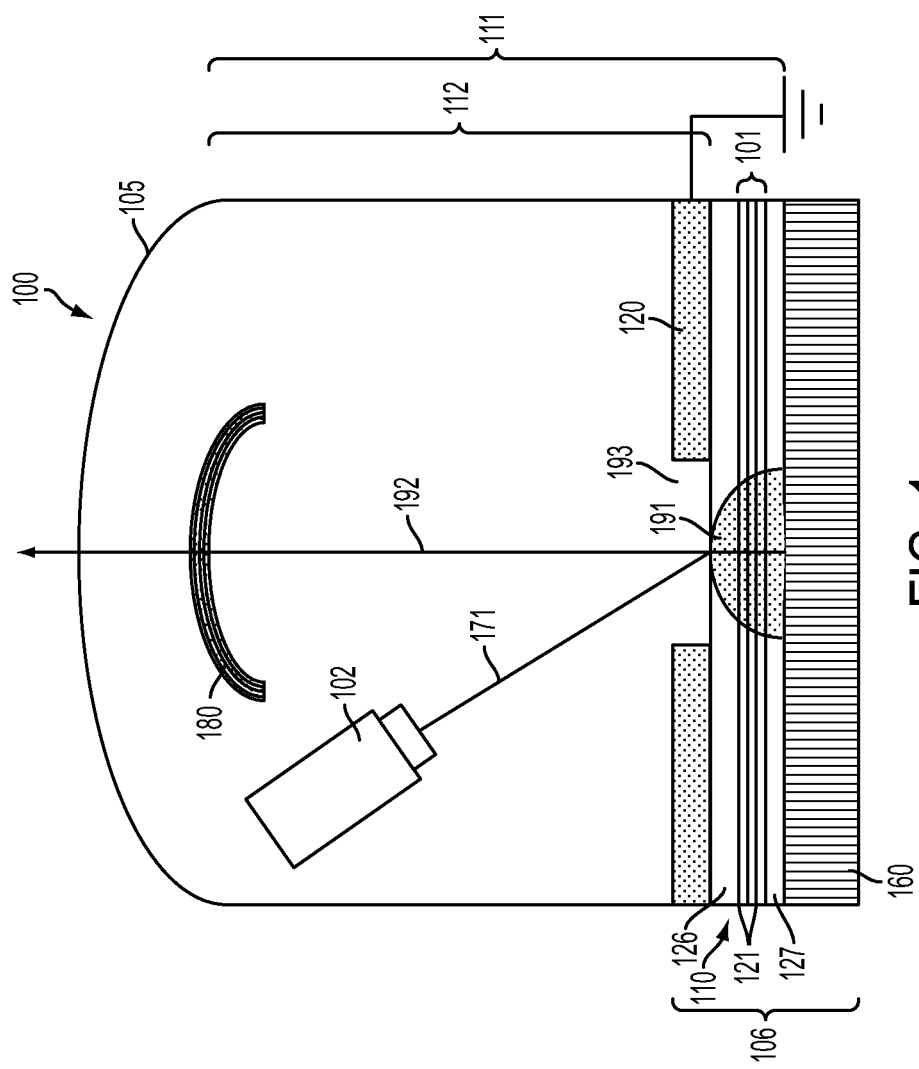
FIG. 1 is a diagram illustrating an electron beam pumped vertical external cavity surface emitting semiconductor laser (VECSEL) in accordance with some embodiments.

FIG. 1 is a diagram illustrating an electron beam pumped semiconductor VECSEL 100 in accordance with some embodiments. The VECSEL 100 comprises several main components including 1) a base laser component 106—including a heterostructure 110 comprising an active region 101, contacts 120 configured to electrically discharge the heterostructure, and a reflector 160 (designated herein as the second reflector), 2) an external reflector 180 (designated herein as the first reflector) which is spaced apart from the active region 101 to form an external cavity 112, and 3) an e-beam pump source 102. The laser cavity 111 is disposed between the two reflectors 180, 160. The heterostructure 110 includes an active region 101 which can comprise one or more quantum well structures 121. Each quantum well structure 121 may include one quantum well or multiple quantum wells separated from each other by relatively thin barrier layers (thin relative to the spacers, for example). The VECSEL 100 includes an electron beam source 102 configured to produce a beam of electrons (e-beam) 171 which are accelerated from the electron beam source 102 and impinge on the heterostructure 110. The angle of the e-beam with respect to the surface of the base laser structure may range from more than 0 degrees to less than 180 degrees. The electrons from the e-beam 171 disperse through the heterostructure 110 and/or other layers, forming an electron cloud 191.

The electron beam 171 can be created by an e-beam source operating at about 1-50 kV acceleration voltage. The electrons from the source have energy that is much greater than the bandgap of the active region material and create electron hole pairs in the active region 101 of the heterostructure 110. Some of these electron hole pairs diffuse to the quantum wells, where they recombine to create the laser radiation. The heterostructure 110 may include a number of semiconductor layers that improve the optical quality of the active region, such as layers that provide strain relief between epitaxially grown semiconductor layers of differing composition.

The VECSEL 100 includes first 180 and second 160 reflectors that define the laser optical cavity 111 including an external cavity 112 between the first reflector 180 and the active region 101. The laser cavity 111 can be configured so that reflections of laser light between the first and second reflectors 180, 160 create a standing wave within the active region 101 such that the antinodes of the standing wave occur near the quantum well structures 121. This type of resonant periodic gain configuration in the active region can lead to optimal gain by the device.

In some configurations, the second reflector 160 includes layers of materials arranged as a distributed Bragg reflector (DBR) and disposed proximate to heterostructure 110. For example, the material layers of the DBR may be selected so that the optical thickness (OT) of each layer is ¼ of the wavelength of the laser light to provide high reflectivity at the laser wavelength, $\lambda_{lase}$. In some cases, to enhance dissipation of heat generated in the active region, the DBR 160 may be mounted on a heat sink (not shown).

The second reflector 180, which serves as an external out-coupling mirror, can also include a plurality of layers forming a DBR, e.g., a ¼-wavelength DBR wherein each layer has an OT of $¼*\lambda_{lase}$. The layers may be disposed on a concave support to form a concave reflector. The concave external mirror 180 serves to stabilize the laser emission and may allow for single mode operation with one or more additional optical elements within the cavity, even at higher power outputs, e.g., greater than about 10 mW. The external portion 112 of the laser cavity 111 can, in general, be any length that supports adequate gain in the active region and the desired optical characteristics, e.g., single mode operation.

As shown in FIG. 1, the heterostructure, 110, first and second reflectors, and the electron beam source may be disposed within a vacuum chamber 105.

The base laser component can be formed by various approaches, depending, for example, on the type of second reflector used. For example, one approach involves the use of an epitaxially grown second reflector comprising alternating layers of a semiconductor material. In this scenario, the second reflector can be epitaxially grown on a substrate or a buffer layer on a substrate. The heterostructure including the active region can then be deposited on the epitaxially grown DBR.

Some embodiments involve structural and/or material configurations for discharging the electrons arising from the electron beam pumping of the heterostructure 110. FIG. 1 shows at least one contact disposed on or over the heterostructure 110. The contact 120 directly or indirectly makes electrical contact with portions of the heterostructure 110 and provides a current path for electrons to flow from the heterostructure 110 to ground. Electrical contacts 120 can be formed of a metal, metal alloy and/or other conductive material. For example, suitable materials for the electrical contacts include one or more of Ti, Al, Au, V, Cr, Ni, Pd, Ag, and Pt. In some embodiments, the electrical contacts may include a multilayer structure which includes one or more layers serving as adhesion layers and one or more layers serving as conductive layers, although this designation is somewhat arbitrary as both types of layers may be electrically conductive. An adhesion layer may be deposited to promote adhesion between the heterostructure layer (or other layer) and subsequent conductive layer. For example, suitable materials for an adhesion layer comprise Ti and suitable materials for a contact layer comprise Au and/or Al. In arrangements where the contact layer is not transparent at the laser wavelength, an aperture 193 (also denoted an opening) in the contact layer 120 is provided at the location where the laser radiation 192 emerges from the base laser structure. In arrangements where the contact layer is optically transparent at the laser wavelength, e.g., for indium tin oxide (ITO) or other transparent conductors, an aperture is not necessary.

To further facilitate current flow through the heterostructure 110, one or more heterostructure layers may be doped with n-type or p-type dopants, increasing the electrical conductivity of the layers. For example, one or more heterostructure layers may be doped with an n-type and/or p-type dopant at a level of about $10^{17}$ to $10^{19}$/cm$^3$ to achieve a conductivity in the doped layers between about 0.01 $(\Omega\text{cm})^{-1}$ and $10^4$ $(\Omega\text{cm})^{-1}$. The impurity concentration is typically less than 3% of the total atomic concentration in the material.

For example, the class of III-N semiconductors including GaN, AlN, InN, BN and alloys of these materials such as AlGaN, InGaN, InAlN, AlBN, GaBN, InBN, and InGaAlN may be employed to fabricate the devices. These materials may be doped n-type by incorporating impurities such as Si, Ge, and Sn. These materials may be doped p-type by including impurities such as Mg, Be, Zn, Cd, or C.

The class of III-As semiconductors including GaAs, AlAs, InAs and alloys of these materials including AlGaAs, InGaAs, and InAlAs may also be employed. These materials may be doped n-type by incorporating impurities such as Si, Ge, Sn, S, Se, and Te. These materials may be doped p-type by including impurities such as Mg, Be, Zn, Cd, Si or Ge.

The II-VI semiconductors, including for example oxides such as ZnO, MgO, CdO together with their alloys ZnMgO, CdMgO, CdMgO, may also be employed in the devices. These materials may be doped n-type by incorporating impurities such as Al, In, and Ga. These materials may be doped p-type by incorporating N.

In some configurations, the heterostructure 110 includes a first heterostructure region 126 and a second heterostructure region 127 with the active region 101 disposed between the first heterostructure region 126 and the second heterostructure region 127. The first heterostructure region 126, the second heterostructure region 127, and the active region 121, e.g., the one or more quantum well structures 125 and spacer layers 124 may each have different doping. For example, in some cases the first heterostructure region 126 and/or the second heterostructure region 127 may have n-type doping. In some cases, the first heterostructure region 126, the second heterostructure region 127, and one or more layers of the active region, e.g., the quantum wells, may have n-type doping. In some cases, the first heterostructure region 126 and the second heterostructure region 127 may not have additional doping, and the quantum wells may have p-type doping.

Figure 2:
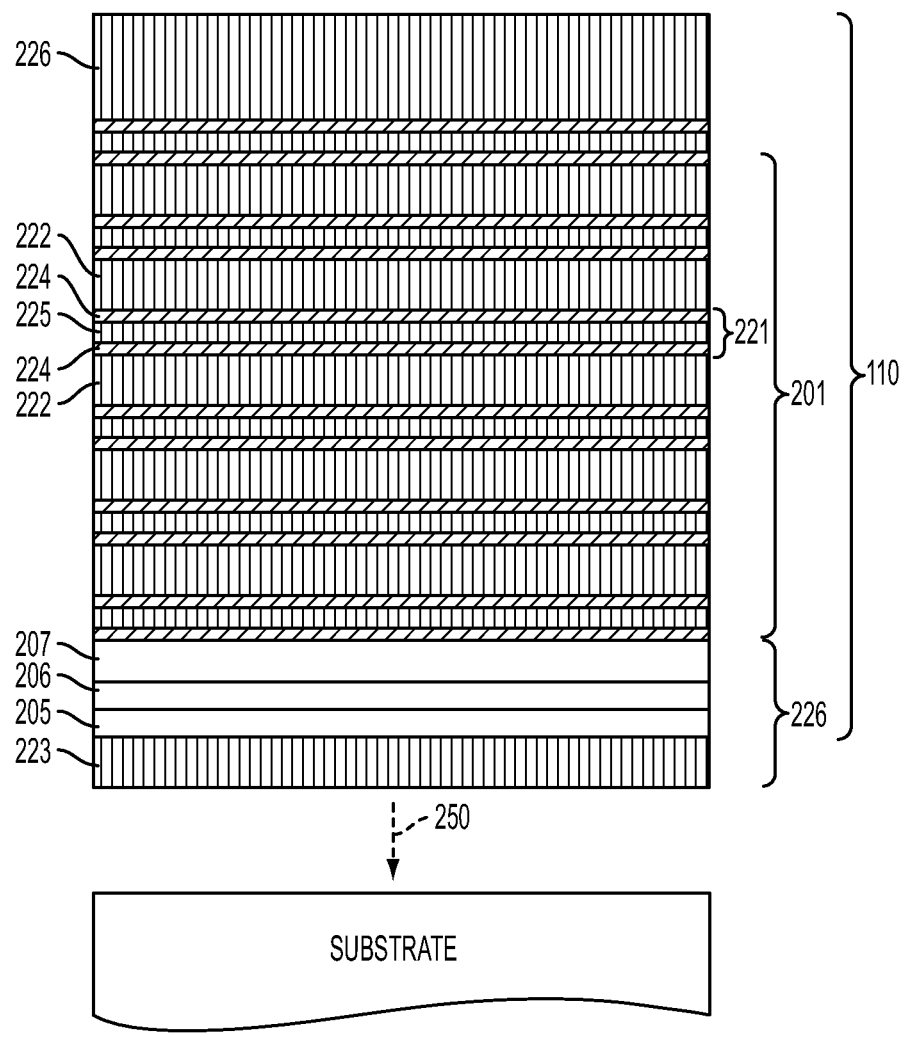
FIG. 2 illustrates a heterostructure used for a VECSEL in accordance with some embodiments.

The heterostructure 110 can be formed by epitaxial growth on a substrate, such as an AlN, GaN, sapphire, SiC, Si, GaAs or other type of substrate, as depicted in FIG. 2. The type of substrate material used depends in part on the type of material system in the active region. The active region 201 is epitaxially grown, e.g., by metal organic chemical vapor deposition (MOCVD), on the substrate or a base layer 223 grown on the substrate. For example, for active regions based on the AlGaN material system, an AlN substrate may be used. For active regions based on the InGaN material system, a GaN substrate may be used. Optionally, the substrate can be removed from the heterostructure 110, e.g., after formation of other heterostructure layers as indicted by arrow 250.

The number and/or type of layers epitaxially grown as heterostructure 110 will depend on the choice of substrate type. The heterostructure 110 may include one or more nucleation layers 205, one or more defect reduction layers 206, and/or one or more strain relief layers 207. These layers can be grown on the substrate prior to, during and/or following growth of the active region 201.

The active region 201 can include one or multiple quantum well structures 221, where each quantum well structure 221 includes at least one quantum well layer 224. Six quantum well structures 221 are depicted in FIG. 2, wherein each quantum well structure 221 includes two quantum wells 224, although in general more than six or fewer than six quantum well structures may be used and each quantum well structure 221 can include more or fewer quantum wells, e.g., 1-40 quantum wells. The quantum wells 224 may comprise any direct bandgap material that produces the desired radiation wavelength. In some cases a III-nitride material, e.g., InGaN, AlGaN, AlInN and AlGaInN, may be used. For example, in an AlGaN system, the quantum wells may comprise $Al_xGa_{1-x}N$, where $20 \leq x \leq 80$. For InGaN quantum wells, the quantum wells may comprise $In_yGa_{1-y}N$, where $5 \leq y \leq 40$. Those skilled in the art will appreciate that the number of different material systems and compositions available to achieve the disclosed embodiments is quite large and the examples given in this disclosure provide a subset of the available possibilities.

As shown in FIG. 2, when multiple quantum wells 224 are present in the quantum well structures 221, thin barriers 225 separate the quantum well layers 224. For AlGaN or InGaN material systems the thin barriers 225 may comprise AlN, or may comprise GaN, for example. If two or more quantum well structures 221 are present in the active region 201, the quantum well structures 221 can be separated from one another by spacer layers 222 which may be the same material as the thin barriers 225, but with thickness greater than the thickness of the thin barriers. Additional layers 226 may be epitaxially grown below, above and/or within the active region 201.

Figure 3:
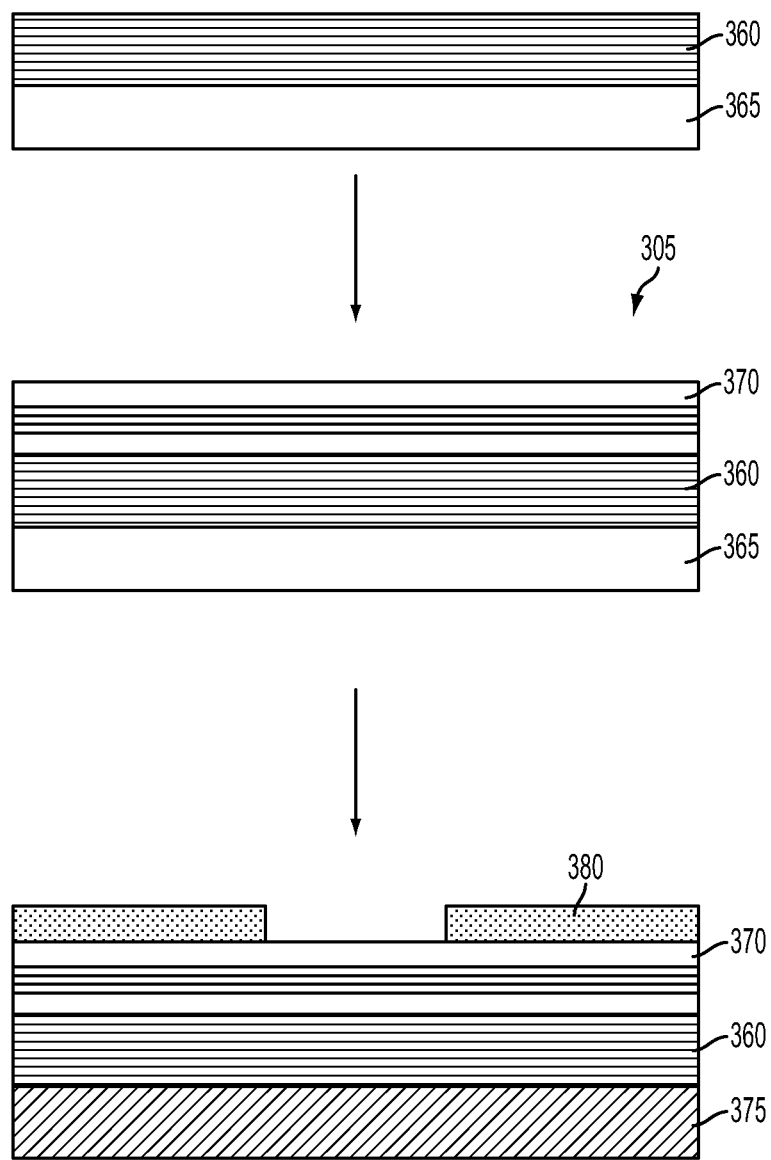
FIG. 3 shows an approach for the formation of a laser structure according to some embodiments involving epitaxially growing a reflector a series of alternating semiconductor layers on a substrate in accordance with some embodiments.

The base laser component can be formed by various approaches, depending, for example, on the type of second reflector used. For example, one approach involves the use of an epitaxially grown second reflector comprising alternating layers of a semiconductor material. In this scenario, the second reflector can be epitaxially grown on a substrate and the heterostructure including the active region can be epitaxially grown on the second reflector. FIG. 3 shows an approach for the formation of a base laser component that involves epitaxially growing a DBR (epi-DBR) 360 comprising a series of alternating semiconductor layers on a substrate 365. For example, if AlN is used as for the substrate 365, then an epi-DBR comprising alternating layers of AlGaN and AlN could be grown directly on the AlN substrate. Using an epi-DBR helps to promote heat dissipation from the active region because the semiconductor layers of the epi-DBR can provide some heat sinking. A heterostructure 370, including the active region is epitaxially grown on the epi-DBR 360. After the epi-DBR+heterostructure subassembly 305 is formed, the substrate 365 may optionally be fully or partially removed, for example, using a laser liftoff process (LLO), mechanical polishing and/or dry/wet chemical etching. In some configurations DBR+ heterostructure subassembly 305 can be bonded epi-DBR side down to a heat sink 375 to enhance heat dissipation from the active region. The heat sink may comprise a metal, metal-alloy or other materials having sufficient thermal conductivity. For example, suitable materials for a heat sink include diamond, copper, copper-tungsten, aluminum, AlSiC, and/or other materials or material composites. Contacts 380 are disposed on or over the free surface of heterostructure 370.

Figure 4:
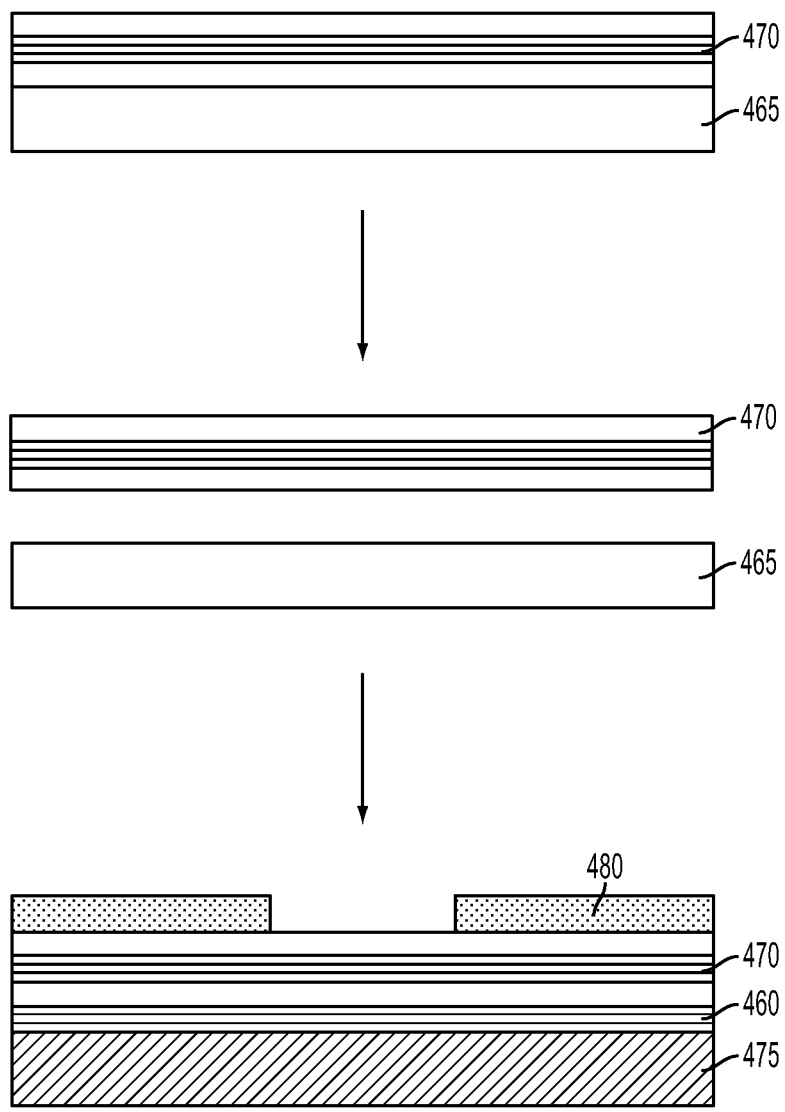
FIG. 4 shows an approach for the formation of a laser structure according to some embodiments which involve a dielectric DBR deposited on the backside of an epitaxially grown heterostructure.

Another approach for the formation of a laser structure, shown in FIG. 4, involves the use of a dielectric DBR which is deposited on the backside of an epitaxially grown heterostructure. Dielectric materials used to form a dielectric DBR can have higher refractive index contrast than semiconductor materials. Thus, for the same reflectivity, a dielectric DBR can have fewer layer pairs when compared to the number of semiconductor layer pairs of an epitaxially grown DBR. However, dielectric materials have lower thermal conductivity which may be a factor for higher power devices that need heat dissipation from the active region.

Formation of the base laser structure shown in FIG. 4 involves epitaxially growing heterostructure 470 on a substrate 465. The substrate 465 is fully or partially removed from the heterostructure 470. After removal of the substrate, a dielectric DBR 460 is deposited on one surface of the heterostructure, e.g. the backside surface which is the surface of initial epitaxial growth of the heterostructure 470. Contacts 490 are disposed on the other heterostructure surface. In the implementation shown in FIG. 4, the DBR+heterostructure subassembly is arranged DBR side down on a heat sink 475 to provide for dissipation of heat generated in the active region.

Figure 5:
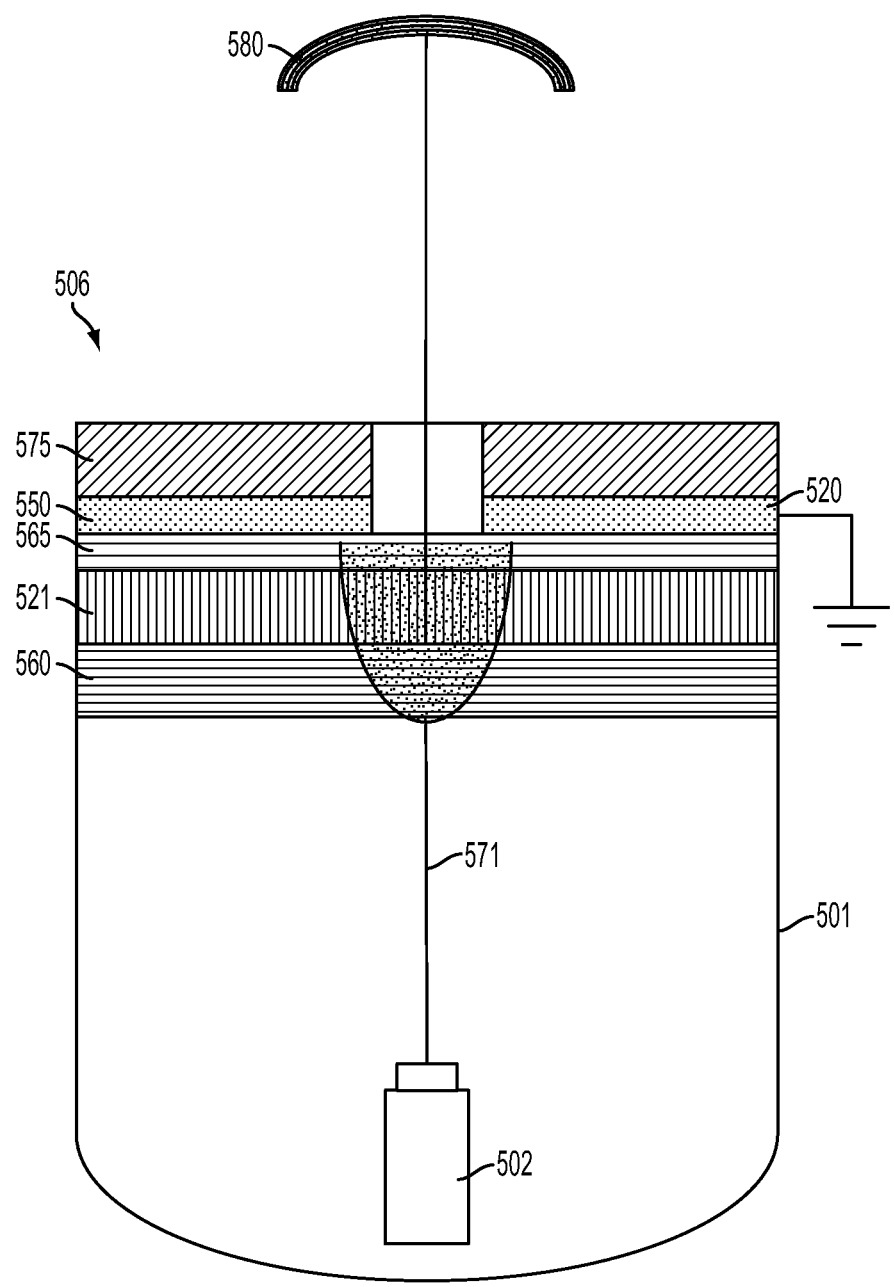
FIG. 5 shows an implementation in accordance with some embodiments wherein the laser component and e-beam source are located within the vacuum chamber and the external reflector and a majority of the external cavity is outside of the vacuum chamber.
Figure 6:
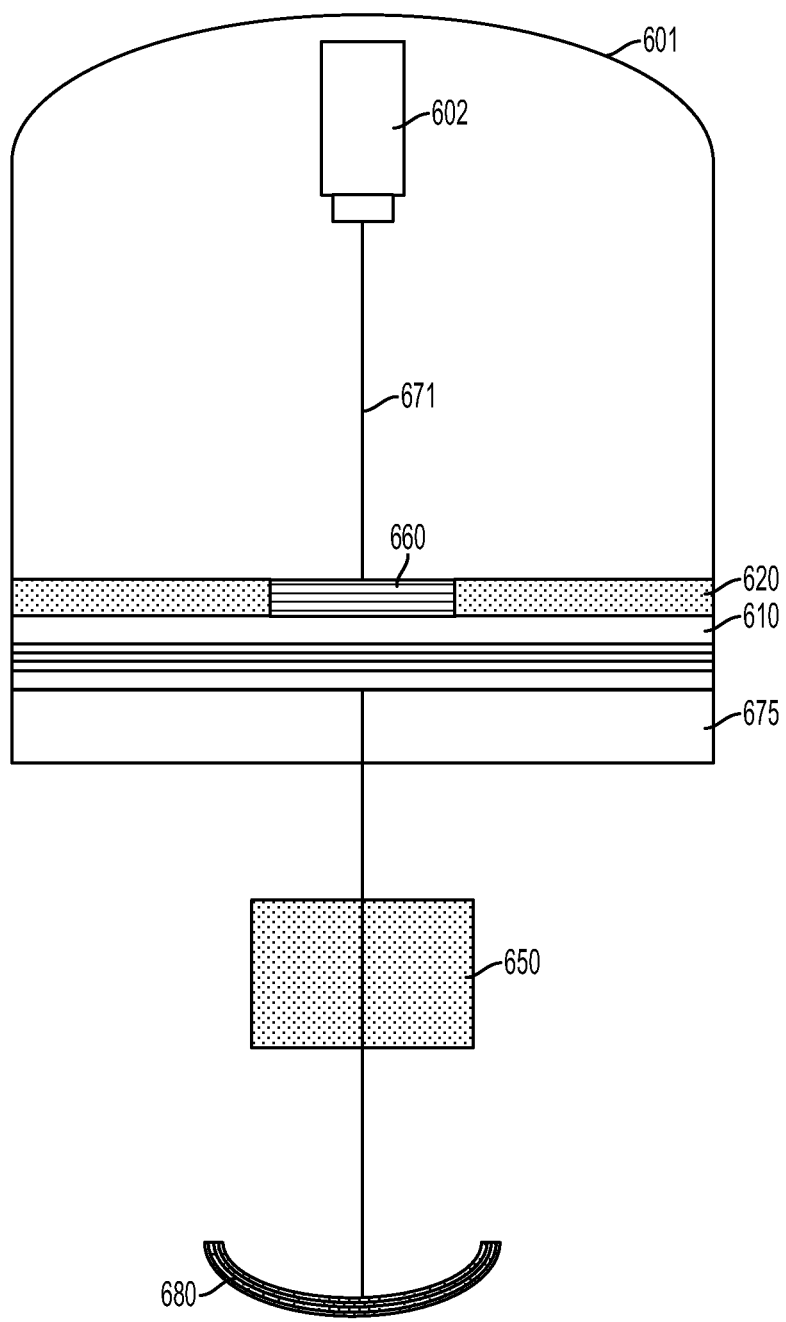
FIG. 6 shows an implementation in accordance with some embodiments wherein a laser structure includes a first reflector located outside the vacuum chamber and the heterostructure is epitaxially grown on a substrate that is substantially transparent at the laser wavelength.

In some configurations, the external reflector may be positioned outside of the vacuum chamber, as shown, for example, in FIGS. 5 and 6. Placement of the external reflector outside of the vacuum chamber facilitates incorporation of additional optical elements within the laser cavity, e.g., one or more of an etalon, a birefringent filter, a frequency converter such as a non-linear crystal and/or other optical elements. FIG. 5 shows an implementation in which the base laser component 506 and e-beam source 502 are located within the vacuum chamber 501 and the first (external) reflector and a majority of the external cavity is outside of the vacuum chamber 501. In the implementation shown in FIG. 5, the electron beam 571 is incident on the second reflector 560 and forms an electron cloud at least in the second reflector 560 and the heterostructure 521. In some cases, it may be beneficial to use an additional reflector 565 disposed between the active region of the heterostructure 521 and the first reflector 580. This additional reflector 565 may be compositionally similar to, but thinner than the 2nd reflector, e.g. the additional reflector may have fewer layers than the 2nd reflector. In some configurations, whereas the first and second reflectors 580, 560 are highly reflective (e.g., greater than 99% reflective) to the laser radiation, the additional reflector may be partially reflective at the wavelength of the laser radiation (e.g., about 40% to about 60% reflective). As previously discussed, layers of the heterostructure 521 may be doped and/or grounded electrical contacts 520 may be used to provide for dissipation of the electrons from the heterostructure layers. In some cases, contacts 520 disposed on the additional reflector 565 may not provide sufficient conductivity between the heterostructure and ground. In these cases, the contacts may be patterned directly on a surface of the heterostructure so that there is at least one opening in the contact layer that provides access to the heterostructure surface. The additional reflector can be disposed directly on the heterostructure layer within the contact layer opening. To enhance heat dissipation, the base laser structure 506 may include one or more heat sink layers 575 may be disposed at one or both sides of the heterostructure 521.

FIG. 6 shows another implementation for a laser structure that includes a first reflector 680 located outside the vacuum chamber 601. In this implementation, the heterostructure 610 which includes the active region is epitaxially grown on a substrate 675 that is substantially transparent at the laser wavelength. Contacts 620 are arranged on the free surface of the heterostructure 610, optionally with a heat sink disposed on the contacts 620. In some cases, as shown in FIG. 6, the contacts 620 are patterned directly on the surface of the heterostructure 610, wherein the patterning includes at least one opening that provides access to the heterostructure surface. The second reflector layers 660 are disposed within the opening in the contact layer 620. The electron beam source 602 in this example is located within the vacuum chamber 601 and generates an electron beam 671 which is directed toward the patterned second reflector 660.

Arranging the contacts directly on the heterostructure can provide for superior discharging of the heterostructure layers when compared with contacts disposed on an insulating component, such as a dielectric DBR. When both contacts and DBR need to be positioned on the same heterostructure surface, patterning can be used so that the DBR and contact is disposed on the heterostructure surface. This technique may also be useful when an epitaxial DBR is used in place of dielectric DBR, because the higher bandgap material within the epi-DBR can also lead to a decreased electrical conductivity between the heterostructure and the contacts.

As illustrated in FIG. 6, the VECSEL structure allows additional optical elements 650 to be inserted within the external cavity. Locating the external reflector 680 and external portion of the laser cavity outside of the vacuum chamber facilitates incorporation of additional optical elements within the external cavity. These additional optical elements can be used to enhance spectral quality and/or provide for other optical enhancements of the laser output. For example, the additional optical element 650 may comprise an etalon configured to enhance the spectral quality by reducing the lasing output modes to a few modes or a single mode. In some implementations, the additional optical element 650 may comprise a birefringent filter which is arranged to enhance spectral quality. In some implementations, the additional optical element 650 may comprise a non-linear crystal that can be used to provide frequency multiplication of the laser radiation. For example, a non-linear crystal may be arranged to provide second harmonic generation (SHG) or higher frequency multiples which would achieve radiation output at twice or more of the frequency of the laser radiation. Using non-linear optics allows for output wavelengths down to about 200 nm or less. Note that the various embodiments discussed herein are not limited to simple two-mirror cavity configurations. It can be beneficial for the frequency conversion process to use a folded mirror configuration using three or even more mirrors. The non-linear crystal can then be placed at a position where the lasing mode waist is smallest and high photon conversion efficiency may be achieved.

Some applications, such as spectroscopy, require relatively high levels of spectral quality in conjunction with relatively high output power. To achieve the level of spectral quality useful for these types of applications, the e-beam source may be arranged so that the e-beam spot made by the e-beam on the heterostructure is stationary. The e-beam may have a cross sectional diameter in a range of about 10 µm to about 500 µm and/or a current between about 10 µA to about 1 mA, for example. When the e-beam is not stationary, i.e., is scanned across the surface of the heterostructure, then even if the e-beam has a narrow width, e.g., about 25 µm, multiple lasing modes will be produced as the e-beam is scanned across multiple positions of the heterostructure. The multiple lasing modes produced by the scanning operation result in reduced spectral quality when compared to a stationary beam, which is capable of producing few lasing modes or a single lasing mode. With the external feedback provided by a curved external mirror in a VECSEL configuration, the beam size of a stationary e-beam can be increased from a beam size (e.g., about 25 µm) typically used in a scanning implementation with little or no reduction in spectral quality. The larger e-beam spot size is also associated with an increase in optical power output. The VECSEL laser structures described herein can use a stationary e-beam having a beam diameter of about 200 µm and may achieve a line width smaller than 0.5 nm at a power output of several tens of milliwatts and more. For example, the power density of the electron beam may be greater than about 20 kW/cm$^2$.

A stationary, higher power e-beam brings additional considerations with regard to heat dissipation because the stationary beam may cause significant heating of the heterostructure, particularly at the location of the beam spot on the heterostructure or other layers. As shown in some embodiments, heat can be dissipated using one or more heat sinks disposed at one or both sides of the heterostructure. Additionally or alternatively, doping of one or more heterostructure layers increases the thermal conductivity of these layers, which allows these layers to more efficiently conduct heat away from the active region.

Figure 7:
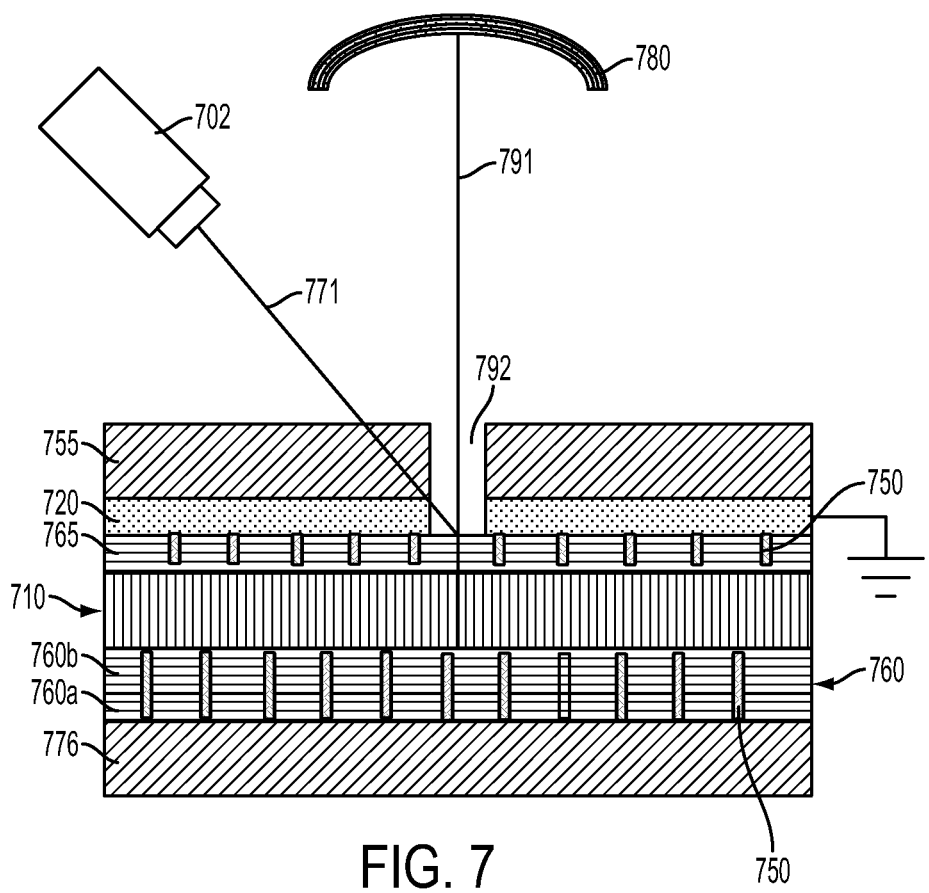
FIG. 7 illustrates a laser structure that includes vias which extend toward and/or into the heterostructure in accordance with some embodiments.

To further enhance heat dissipation, the thermal connection between the heat sink and the heterostructure layers may be augmented using vias that may be filled with metal or other electrically and/or thermally conductive material, which protrude toward or into the layers of the heterostructure. The vias may be arranged to make a thermal connection to the heat sink or contact that has a higher thermal conductivity than the layers surrounding the vias. An example of such a configuration is illustrated in FIG. 7. The laser structure of FIG. 7 includes a heterostructure 710 comprising an active region, which may be configured to include one or more multiple quantum wells as previously discussed. The heterostructure 710 is disposed between a first (external) reflector 780 and a second reflector 760. To enhance recycling of the radiation back to the active region, an additional reflector 765 can optionally be arranged between the heterostructure 710 and the external reflector 780. For example, in some cases, the additional reflector 765 may be thinner and/or include fewer alternating pairs and/or have lower reflectivity to the laser radiation in comparison with the second reflector 760.

As previously discussed, dielectric materials provide highly reflective DBRs, but generally have relatively low electrical and thermal conductivity, e.g. lower electrical and thermal conductivity than semiconductor materials. Thus, the use of a dielectric DBR as the second reflector may be an impediment to heat removal for the laser device. As depicted in FIG. 7, the low thermal conductivity of the dielectric DBR may be mitigated while still retaining the highly reflective properties by using a dielectric DBR 760a in conjunction with an epitaxially grown semiconductor DBR 760b. The dielectric DBR 760a and the epi-DBR 760b are used together as the second reflector 760. The higher thermal conductivity of the semiconductor layers of the epi-DBR 760b increases the overall thermal conductivity of the second reflector 760 in comparison to the thermal conductivity of a second reflector that relies solely or predominantly on dielectric materials. In various implementations, the second reflector 760 and/or the additional reflector 765 may be formed using only semiconductor layers or only dielectric layers, however, second reflectors comprising a combination of semiconductor and dielectric layers takes advantage of the higher thermal conductivity of the semiconductor materials as well as the higher refractive index contrast of the dielectric materials. As illustrated in FIG. 7, if a heat sink 775 and/or contact layer 720 is used at a surface of the heterostructure 710 through which the laser radiation 791 emerges, then an aperture 792 may be provided in the contact 720 and/or heat sink 775 layers to facilitate extraction of the laser radiation 791.

As illustrated in FIG. 7, to promote conduction of electrical and/or thermal energy through the layers of the laser structure, a number of vias 750 may be etched or otherwise formed to extend from the heat sink 775 and/or contact 720 at least partially through the reflectors 760, 765 and/or the heterostructure 710. The vias 750 can be filled with a metal or other good electrical and thermal conductor, such as Au or Ag. For example, each of the vias 750 may have a cross sectional area of about 100 µm to provide a selected level of augmentation in the thermal and/or electrical conductivity between the heat sink 775 and/or contact 720 and the heterostructure 710.

It can be helpful to position the quantum wells within the active region to achieve a homogeneous carrier distribution in all quantum wells. In some implementations, the density of quantum wells within the active region may increase as a function of distance starting from the side or surface of the active region farthest from the location where the electron beam first enters the active region. This configuration results in a higher density of quantum wells in the portion of the active region where the e-beam is stronger and a larger percentage of the carriers are created by the electron beam.

Figure 8:
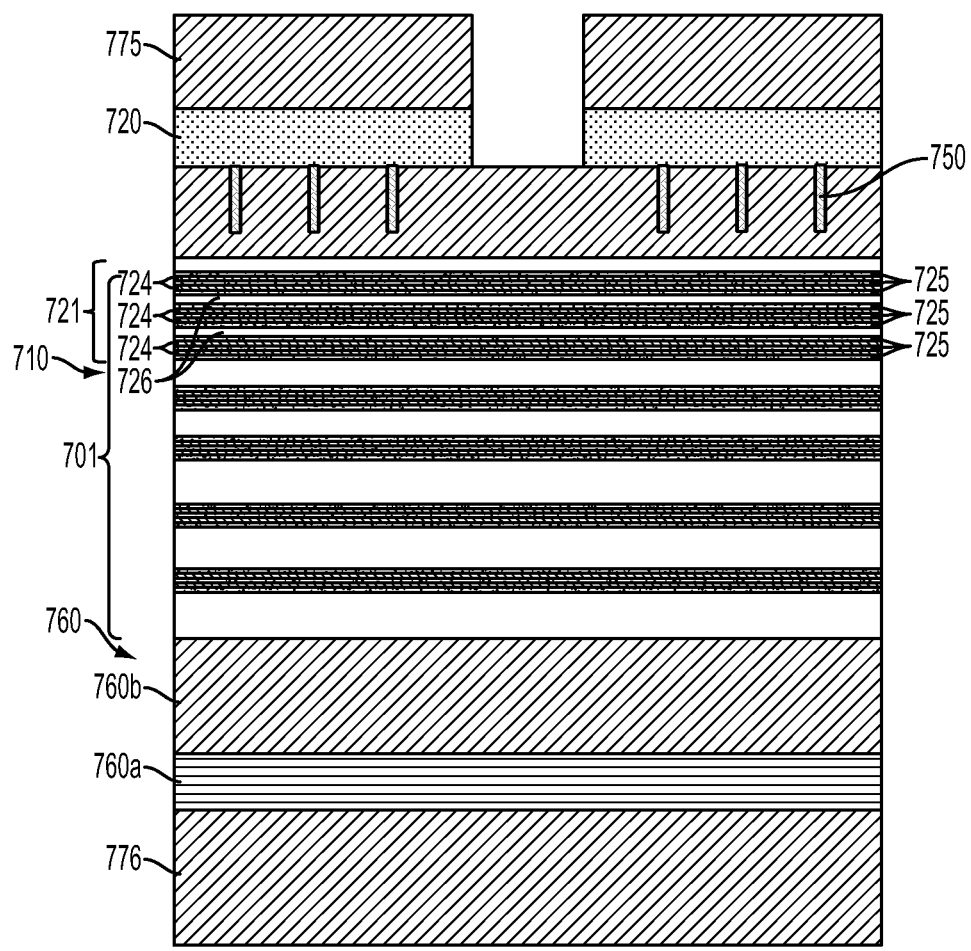
FIG. 8 illustrates a heterostructure according to some embodiments, the heterostructure comprising an active region including quantum well structures arranged with increasing density closer to the side of the active region where the e-beam enters the active region.
Figure 9:
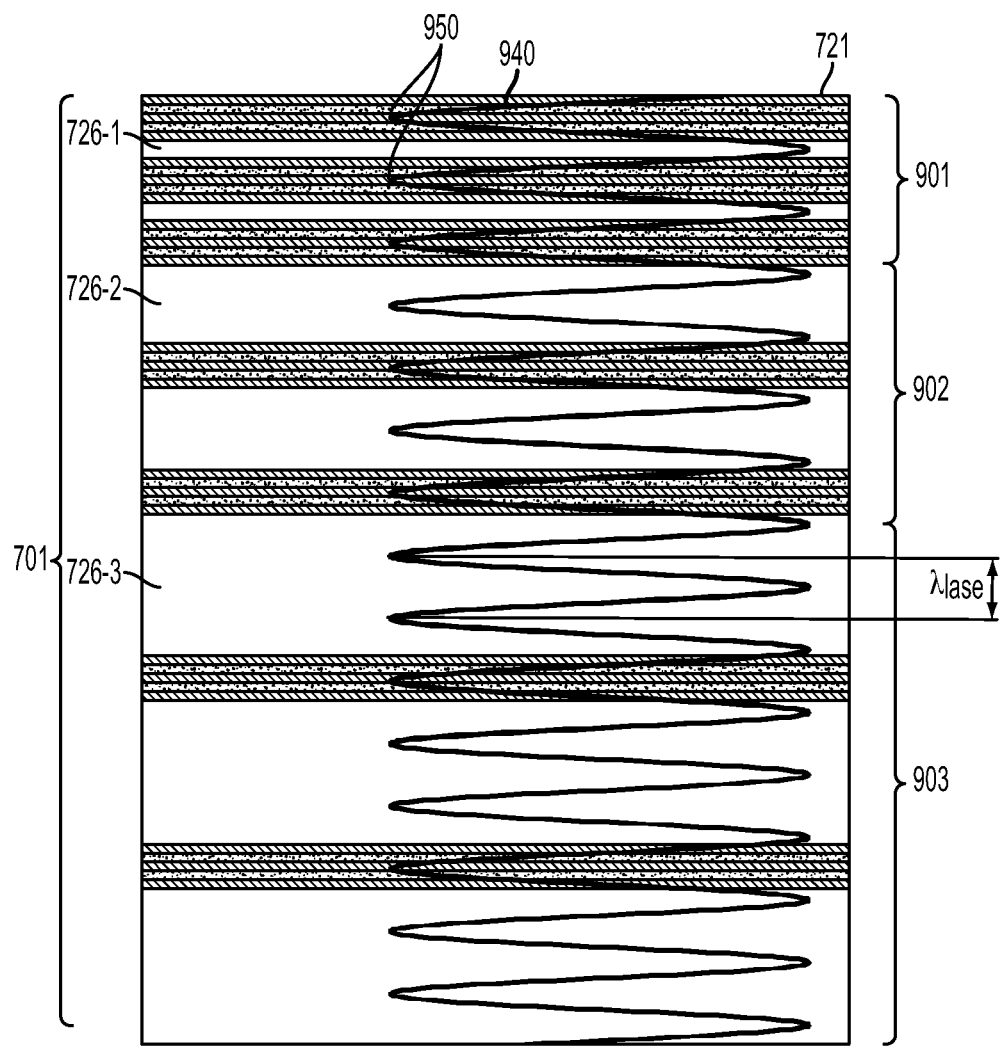
FIG. 9 shows an alignment of antinodes and quantum well structures in accordance with some embodiments.

FIGS. 8 and 9 depict some portions of the laser structure of FIG. 7 with the active region 701 shown more detail, where like reference numbers refer to similar structures in FIGS. 7-9. FIG. 8 illustrates a heterostructure 710 comprising an active region 701 including six quantum well structures 721 arranged with increasing density closer to the side of the active region 701 where the e-beam enters the active region 701. In this particular implementation, each quantum well structure 721 comprises three quantum wells 725 with thin spacer layers 724 between the quantum wells 725. Thick spacer layers 726 are arranged between the quantum well structures 721.

FIG. 9 shows the active region 721 of the device illustrated in FIG. 7. The active region 721 includes a portion 901 having a relatively higher density of quantum well structures; a second portion 902 having a moderate density of quantum well structures; and a third portion 903 having a lower density of quantum well structures. A depiction of the laser radiation 940 having a wavelength, $\lambda_{lase}$, is superimposed on the active region 701. The quantum well structures 721 of the active region 701 are spaced apart by the thick spacers 726-1, 726-2, 726-3. The thickness of the spacer layers 726-1, 726-2, 726-3 in regions 901, 902, 903 varies so that the antinodes 950 of the laser radiation 940 are aligned with quantum well structures 721, and the density of the quantum well structures 721 varies with distance from the point where the e-beam enters the active region. The thickness of a quantum well structure, $QW_t$, plus the distance of a spacer layer, $SLm_t$, is a multiple of half the wavelength within the material of the primary longitudinal mode of laser radiation, $\lambda_{lase}$, where m=1, 2, and 3 in portions 1, 2, and 3, respectively. As depicted in FIG. 9, in the first portion 901, $QW_t + SL1_t = 1 \times (\lambda_{lase}/2n)$; in the second portion 902, $QW_t + SL2_t = 2 \times (\lambda_{lase}/2n)$; and in the third portion 903, $QW_t + SL3_t = 3 \times (\lambda_{lase}/2n)$, where n is the effective refractive index of the material.

There are other ways to achieve varying density of the quantum wells with distance while maintaining a resonant periodic gain structure. For example in some configurations, the quantum wells structures closer to the electron beam source may include more quantum wells when compared the quantum well structures farther from the quantum well source.

Figure 10:
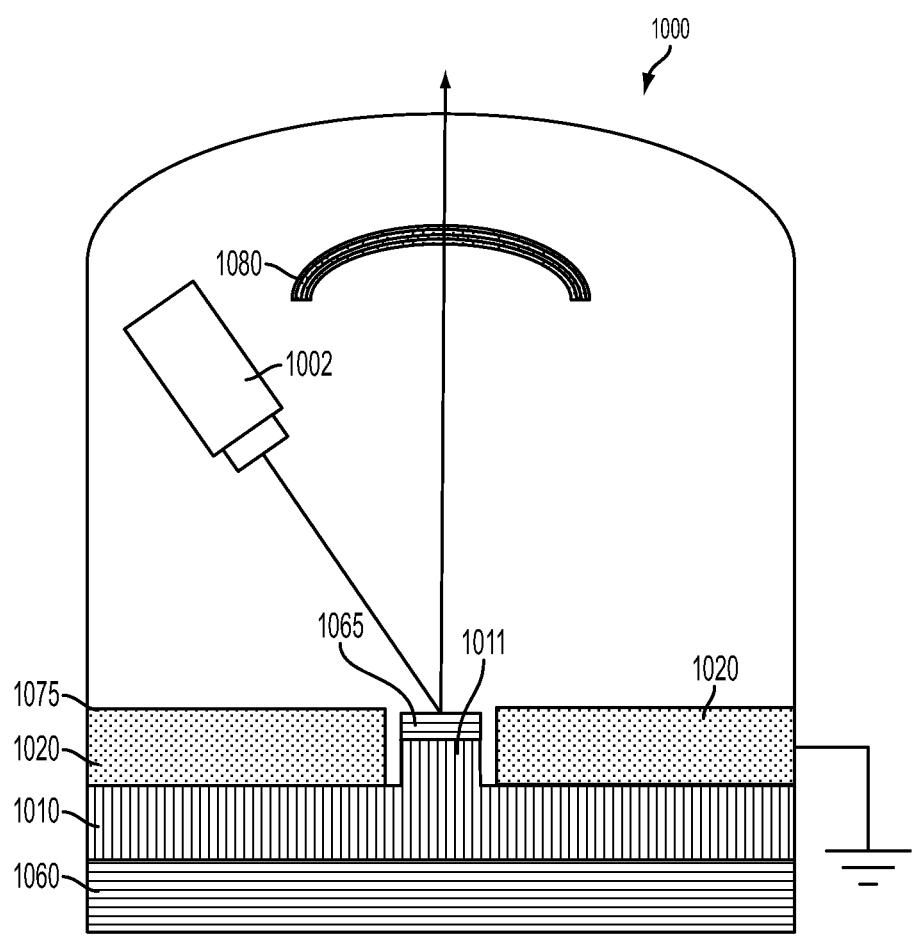
FIG. 10 illustrates a laser structure that includes a mesa feature in accordance with some embodiments.

A laser cavity may have multiple longitudinal modes and multiple lateral modes. Some laser implementations may include one or more features, such as mesas, that provide enhanced lateral mode confinement of the laser output radiation. FIG. 10 illustrates a laser structure 1000 that includes a mesa feature 1011 having a circular cross-section which can be formed by partially etching away the semiconductor layers of the heterostructure 1010. For example, the cross sectional diameter of the circular mesa feature 1011 may be in a range of about 10 µm to about 500 µm. Although a circular mesa feature is described here as an example shape, it will be appreciated that one mesas having various other cross-sectional shapes, e.g., ellipse, square, rectangular, etc., could be used to achieve lateral mode confinement. The heterostructure 1010 is disposed between the first 1080 and second reflectors 1060. FIG. 10 shows a possible orientation for the electron beam source 1002, the first and second reflectors 1080, 1060, and the heterostructure 1010, although various other orientations are possible.

A patterned dielectric DBR 1065 is deposited on the mesa feature 1011 shown in FIG. 10. A higher refractive index would result below the non-etched areas of the mesa features 1011 and the lateral mode of the laser radiation would be better confined in these regions 1011. Metal contacts 1020 can be formed around the mesa features 1011 on the surface of the heterostructure 1010.

FIGS. 11 through 15 provide several examples for laser structures. These examples provide only a subset of the various arrangements that could be used for e-beam pumped VECSELS, which are considered to fall within the scope of this disclosure. For example, each of the examples illustrated in FIGS. 11 through 15 could be used in conjunction with various configurations discussed herein, such as contacts disposed at one or both sides of the heterostructure, heat sinks disposed at one or both sides of the heterostructure, vias disposed at one or both sides of the heterostructure, patterned dielectric and/or epitaxially grown semiconductor DBRs and/or patterned contacts on one or both sides of the heterostructure and/or lateral confinement features, including mesa features used with patterned DBR and/or contact layers.

Figure 11:
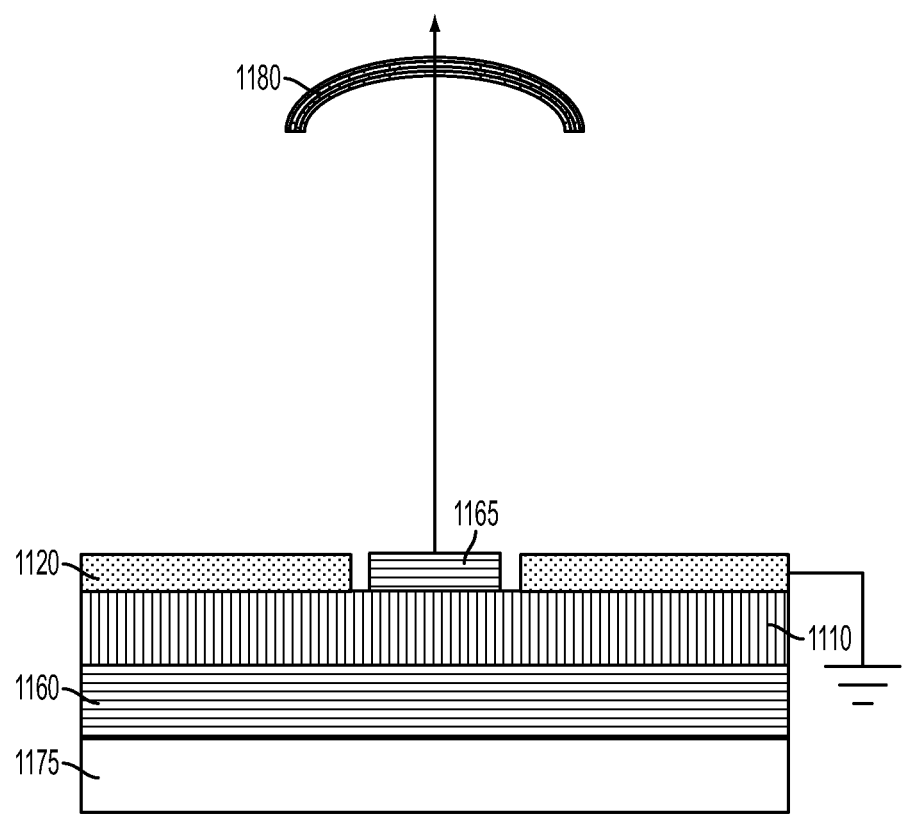
FIG. 11 depicts a laser structure that includes a second reflector which is epitaxially grown on a substrate and an optional reflector disposed in a pattern on the heterostructure in accordance with some embodiments.

FIG. 11 depicts a laser structure that includes a second reflector 1160 which is epitaxially grown on a substrate 1175. The substrate 1175 may be opaque or transparent at the wavelength of the laser radiation. A laser heterostructure 1110 including an active region is epitaxially grown on the second reflector 1160. An optional additional reflector 1165 is epitaxially grown in a pattern on the heterostructure 1110. The additional reflector 1165 may be electrically isolating and may comprise an epitaxially grown DBR or a dielectric DBR. One or more contacts 1120 are disposed on the heterostructure surface. In another variation, the contacts 1120 may be patterned on the heterostructure surface, e.g., with a number of openings in the contact layer 1120. The additional reflector 1165 may be disposed on the heterostructure 1110 within the openings in the patterned contact layer 1120. A heat sink layer (not shown in FIG. 11) may be disposed at either side of the heterostructure.

Figure 12:
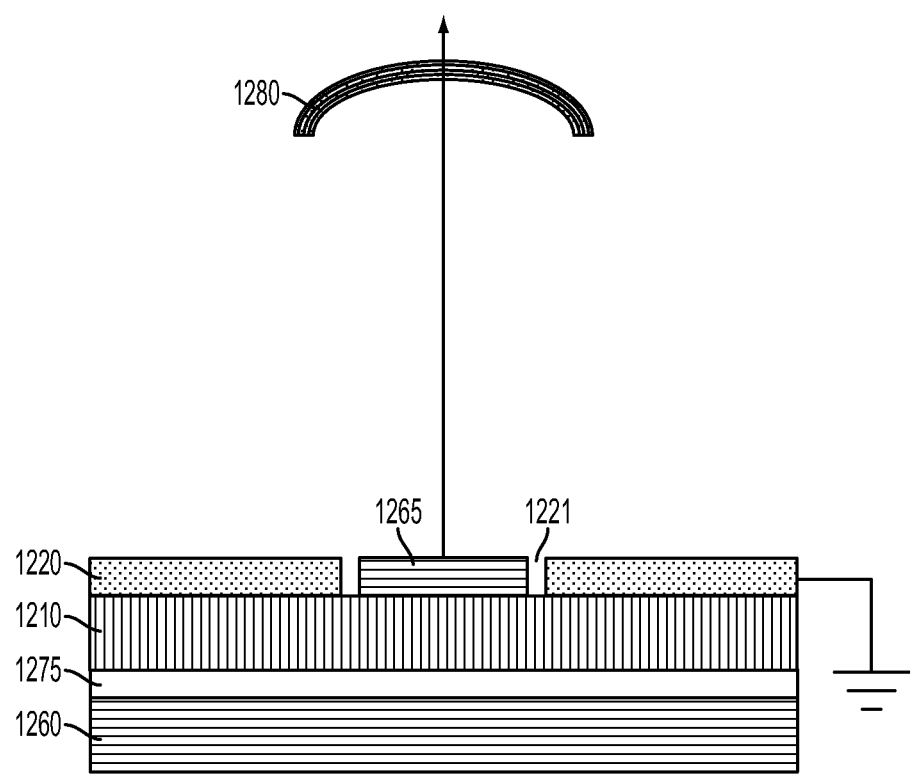
FIGS. 12 and 13 show laser structures wherein the heterostructure is grown on a substrate that is substantially transparent at the laser wavelength.

FIG. 12 shows another alternative laser structure. In this configuration, the heterostructure 1210 is grown on a substrate 1275 that is substantially transparent at the laser wavelength. An additional reflector 1275, e.g., with patterning as discussed in connection with FIG. 11, may optionally be disposed on the heterostructure 1210. The additional reflector 1265 may comprise semiconductor layers epitaxially grown on the heterostructure and/or may comprise deposited dielectric layers and/or may be electrically isolating. After growth of the heterostructure 1210 and/or additional reflector 1265, the substrate 1275 is thinned, e.g., to a thickness of about 10 µm to 200 µm. The second reflector 1260, comprising a dielectric DBR, is deposited on the free surface of the thinned substrate 1275. A heat sink layer (not shown in FIG. 12) may be disposed on either side of the heterostructure 1210. As an example, the transparent substrate may comprise AlN or sapphire. Sapphire may be implemented as a low cost alternative.

Figure 13:
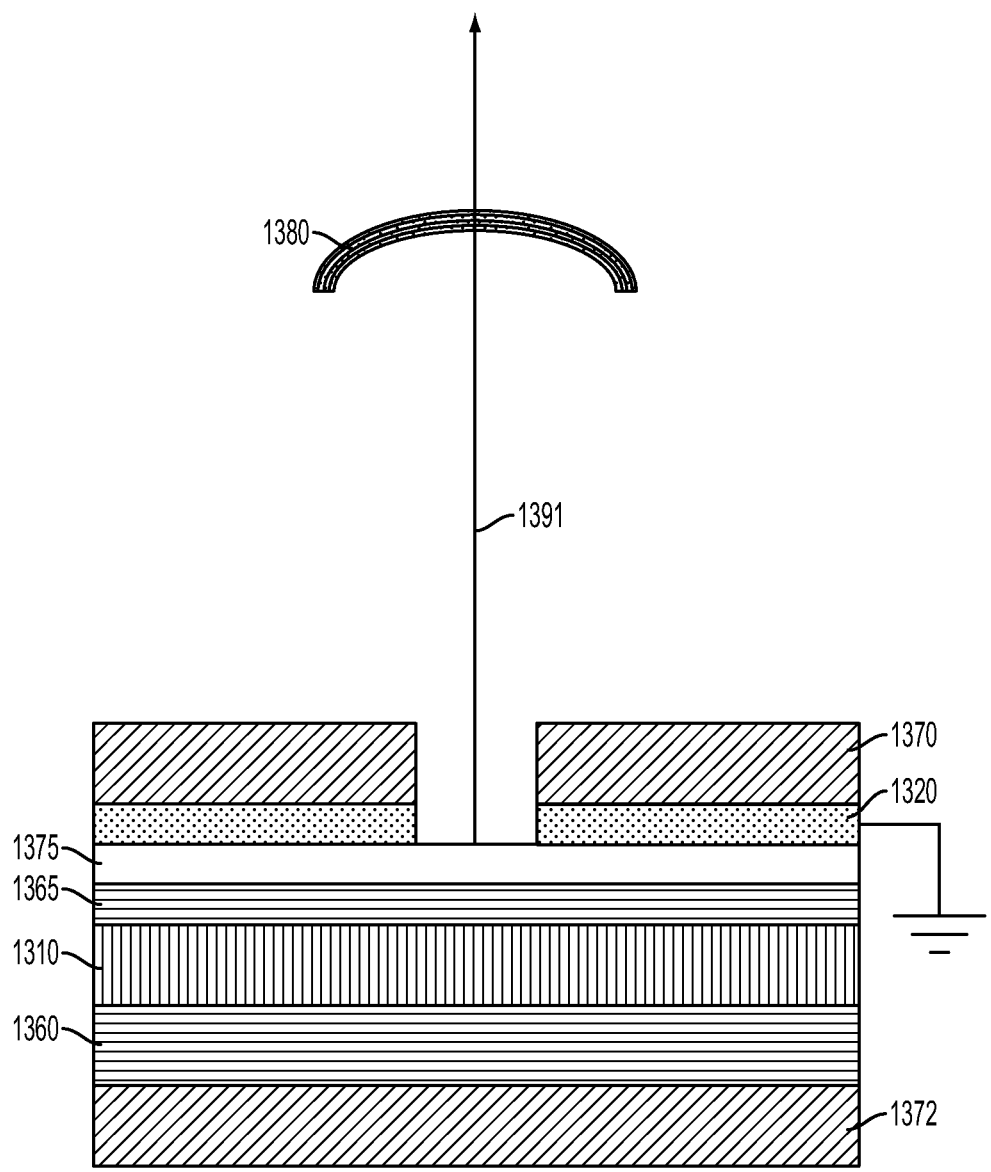

FIG. 13 shows an alternative laser structure that includes a heterostructure 1310 grown on a substrate 1375 that is substantially transparent at the laser wavelength. An additional epitaxially grown reflector 1365 may be disposed between the transparent substrate 1375 and the heterostructure 1310. The first reflector 1380 is spaced apart from the heterostructure 1310 by an external cavity. The second reflector 1360 may be epitaxially grown (epi-DBR) or deposited (dielectric DBR) on the free surface of the heterostructure 1310. Contacts 1320 are disposed on the transparent substrate 1375. One or more heat sink layers 1370, 1372 may be disposed over the contacts 1320 and/or may be disposed at either side of the heterostructure 1310. In this configuration, the laser light 1391 emerges through the transparent substrate 1375 and is directed toward the external reflector 1380.

Figure 14:
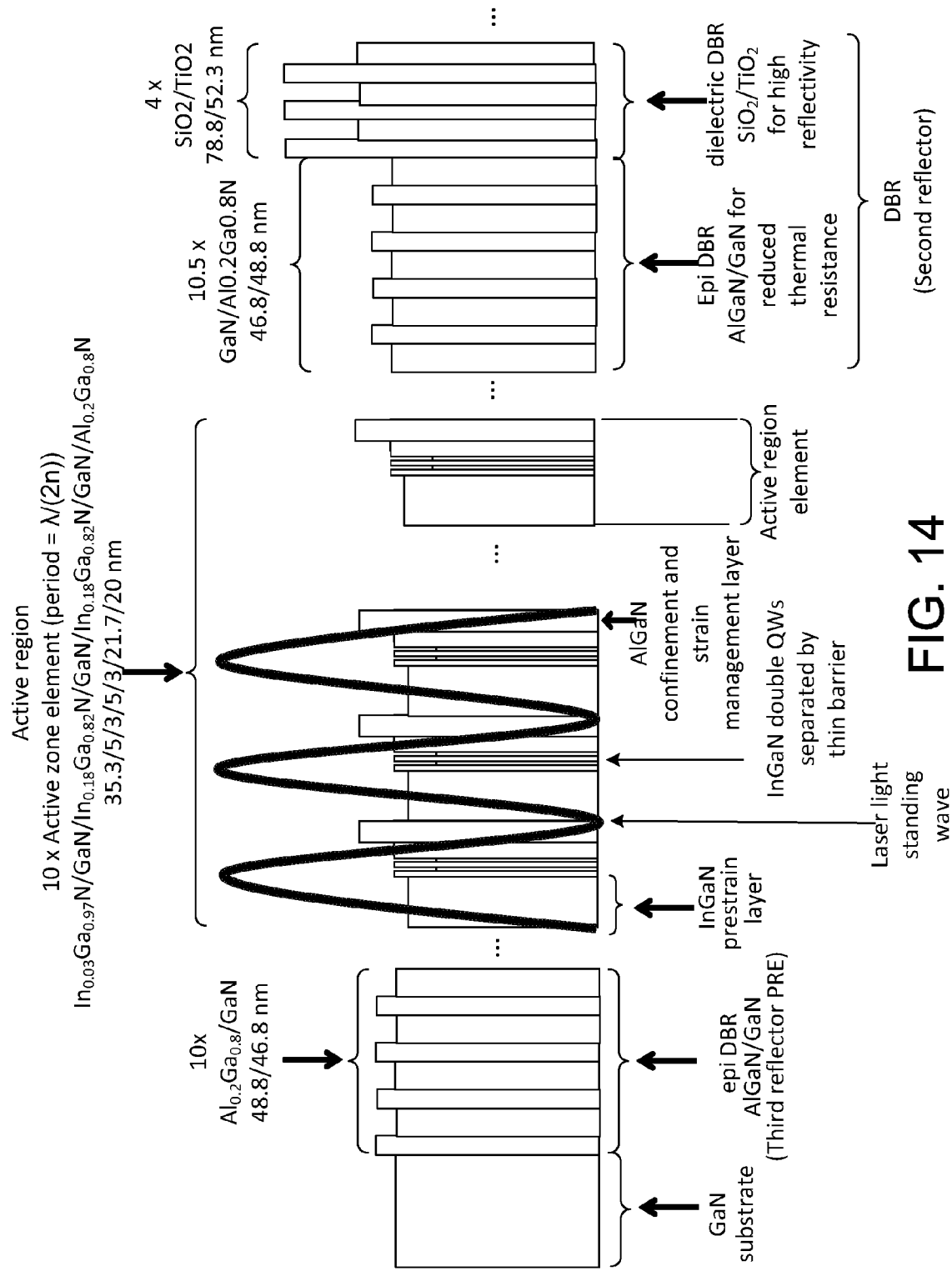
FIG. 14 depicts a base laser component of an example VECSEL structure in accordance with some embodiments.

FIG. 14 is a more detailed view of a base laser component of an example VECSEL structure. The first (external) reflector and the external cavity are not shown in FIG. 14. The device layers are formed from left to right starting with the GaN substrate. An optional additional reflector may comprise a DBR, which is partially reflective at the laser wavelength, is grown on the GaN substrate. The optional additional reflector may comprise 10 periods of $Al_{0.2}Ga_{0.8}N$/GaN, where the $Al_{0.2}Ga_{0.8}N$ layers are about 48.8 nm thick and the GaN layers are about 46.8 nm thick having a reflectivity of about 40% to about 60% at the laser wavelength. For example, the thickness of the AlGaN layer may be about $\lambda_{lase}/4n_{AlGaN}(\lambda_{lase})$ and the thickness of the GaN layer may be about $\lambda_{lase}/4n_{GaN}(\lambda_{lase})$.

The active region includes multiple active region elements, such as about 10 periods of active region elements, is grown on the optional reflector. Each of the active region elements includes a double quantum well structure based on InGaN. Each active region element may include in order the following layers: an InGaN pre-strain layer ($In_{0.03}Ga_{0.97}N$, 35.3 nm thick), a first thin spacer (GaN, 5 nm thick), a first quantum well, ($In_{0.18}Ga_{0.82}N$, 3 nm thick), a second thin spacer (GaN, 5 nm thick), a second quantum well, ($In_{0.18}Ga_{0.82}N$, 3 nm thick), a thick spacer (GaN, 21.7 nm thick), and an AlGaN carrier confinement and strain management layer ($Al_{0.2}Ga_{0.8}N$, 20 nm thick).

The second reflector may comprise one or more of epitaxial semiconductor layers and non-epitaxial dielectric layers arranged as a DBR. For example, in come configurations, the second reflector may comprise an epitaxial DBR comprising GaN/AlGaN, such as 10.5 periods of GaN/$Al_{0.2}Ga_{0.8}N$, where the GaN layers are about 46.8 nm thick and the AlGaN layers are about 48.8 nm thick. A second reflector portion comprising a non-epitaxial dielectric DBR may be deposited on the epitaxial DBR. For example, the dielectric DBR may comprise 4 periods of $SiO_2/TiO_2$, wherein the SiO2 layers are 78.8 nm thick and the $TiO_2$ layers are 52.3 nm thick. If two DBR mirrors are joined together to create a single hybrid DBR the highest reflectivity at the target wavelength is obtained when the high refractive index material of the first DBR is in contact with the low refractive index material of the second DBR. Thus the hybrid DBR will have contact between GaN and $SiO_2$ because GaN has a higher refractive index than AlGaN and $SiO_2$ has a lower refractive index than $TiO_2$. The dual DBR that includes an epitaxial semiconductor portion and a non-epitaxial dielectric can be used to achieve a specified thermal conductivity and reflectivity. The epitaxial semiconductor portion can have higher thermal conductivity than the non-epitaxial dielectric portion, whereas the non-epitaxial dielectric portion provides higher reflectivity than the epitaxial-semiconductor portion. In some cases, both the epitaxial DBR and the non-epitaxial DBR are ¼-wavelength DBRs.

A number of values and ranges are provided in various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in radiation of the above teaching.

The invention claimed is:

1. A vertical external cavity surface emitting laser (VECSEL) structure, comprising:
   a first reflector;
   a second reflector;
   a heterostructure comprising an active region that includes one or more quantum well structures comprising AlGaInN configured to emit radiation at a wavelength, $\lambda_{lase}$, having a range from about 200 to about 400 nm, in response to pumping by an electron beam, the active region disposed between the first reflector and the second reflector and spaced apart from the first reflector by an external cavity;
   an electron beam source configured to generate the electron beam which is directed toward the active region; and
   one or more electrical contacts, each of the contacts having the same electrical potential and electrically coupled to the heterostructure and configured to provide a current path that discharges electrons arising from the electron beam pumping of the heterostructure.

2. The structure of claim 1, further comprising a vacuum chamber, wherein the second reflector, the heterostructure, the at least one electrical contact are disposed within the vacuum chamber and the first reflector is disposed outside the vacuum chamber.

3. The structure of claim 1, wherein the heterostructure comprises a M-N semiconductor having one or more layers with n- or p-type doping in a range between about $10^{17}/cm'$ to about $10^{20}/cm^3$ and the n-type doping includes one or more of Si, Ge, and Sn and the p-type doping includes one or more of Mg, Be, Zn, Cd, and C.

4. The structure of claim 1, wherein the electron beam source is configured to produce a stationary electron beam.

5. The structure of claim 1, wherein the electron beam has at least one of:
   a cross sectional diameter of about 10 µm to about 500 µm; and
   a power density of the electron beam is greater than about 20 $kW/cm^2$.

6. The structure of claim 1, further comprising an optical element disposed within the optical cavity.

7. The structure of claim 1, wherein each of the quantum well structures are located substantially at an antinode of the radiation.

8. The structure of claim 1, further comprising a substrate comprising AlN or GaN or sapphire.

9. The structure of claim 8, wherein the substrate has a thickness less than about 100 µm.

10. The structure of claim 1, further comprising a heat sink arranged to remove heat from the active region.

11. The structure of claim 10, wherein the heat sink is adjacent the second reflector.

12. The structure of claim 10, wherein the heat sink comprises one or more of diamond, copper, copper-tungsten, aluminum, and AlSiC.

13. The structure of claim 1, wherein the first and second reflectors have reflectivity greater than 99% at the wavelength, $\lambda_{lase}$.

14. The structure of claim 1, wherein the structure is configured to provide output radiation having a line width smaller than 0.5 nm at a power output of more than 20 mW.

15. A vertical external cavity surface emitting laser (VECSEL) structure, comprising:
   a first reflector;
   a second reflector;
   a heterostructure comprising an active region that includes one or more quantum well structures comprising AlGaInN configured to emit radiation at a wavelength, $\lambda_{lase}$, having a range from about 200 to about 400 nm, in response to pumping by an electron beam, the active region disposed between the first reflector and the second reflector and spaced apart from the first reflector by an external cavity, the active region having a resonant periodic gain structure such that antinodes of a standing wave in the active region occur near the quantum well structures;
   an electron beam source configured to generate the electron beam which is directed toward the active region; and
   one or more electrical contacts electrically coupled to the heterostructure and configured to provide a current path that discharges electrons arising from the electron beam pumping of the heterostructure, each of the electrical contacts having the same electrical potential.

16. A method, comprising:
   epitaxially growing a heterostructure comprising an active region having one or more quantum well structures comprising AlGaInN and configured to emit radiation in response to an electron beam, the radiation having a wavelength, $\lambda_{lase}$, in a range of 200 to 400 nm;
   forming a second reflector comprising a distributed Bragg reflector (DBR);
   forming one or more electrical contacts electrically coupled to the heterostructure, each of the electrical contacts having the same electrical potential;

arranging the heterostructure, the second reflector, the electrical contact, and a first reflector so that the heterostructure is disposed between the first reflector and the second reflector and the heterostructure is spaced apart from the first reflector by an external cavity; and arranging an electron beam source to generate the electron beam that pumps the active region, wherein the electrical contact is configured to electrically discharge electrons arising from electron beam pumping of the heterostructure.

17. The method of claim 16, wherein:

epitaxially growing the heterostructure comprises epitaxially growing the heterostructure on a first major surface of a substrate; and thinning the substrate to a thickness less than about 100 µm.

18. The method of claim 17, wherein the substrate comprises AlN or GaN.

19. The method of claim 17, wherein forming the second reflector comprises depositing a dielectric distributed Bragg reflector (DBR) on a second major surface of the thinned substrate.

20. The method of claim 16, wherein:

epitaxially growing the heterostructure comprises epitaxially growing the heterostructure on a first major surface of a substrate; and removing the substrate.

21. The method of claim 20, wherein forming the second reflector comprises depositing a dielectric distributed Bragg reflector (DBR) on the heterostructure.

* * * * *